United States Patent
Joshin

(10) Patent No.: US 8,586,994 B2
(45) Date of Patent: Nov. 19, 2013

(54) SEMICONDUCTOR DEVICE

(75) Inventor: Kazukiyo Joshin, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/558,510

(22) Filed: Jul. 26, 2012

(65) Prior Publication Data

US 2013/0056746 A1  Mar. 7, 2013

(30) Foreign Application Priority Data

Sep. 1, 2011  (JP) .................................. 2011-190999

(51) Int. Cl.
| | |
|---|---|
| H01L 31/0256 | (2006.01) |
| H01L 31/0328 | (2006.01) |
| H01L 31/0336 | (2006.01) |
| H01L 31/072 | (2012.01) |
| H01L 31/109 | (2006.01) |

(52) U.S. Cl.
USPC ...................... 257/76; 257/194; 257/E29.246

(58) Field of Classification Search
USPC ............ 257/76, 107, 194, E21.158, E29.246, 257/E29.255
See application file for complete search history.

(56) References Cited

U.S. PATENT DOCUMENTS

| | | | |
|---|---|---|---|
| 2004/0135169 A1* | 7/2004 | Yoshii et al. .................. | 257/107 |
| 2009/0278197 A1 | 11/2009 | Ohta | |
| 2011/0156050 A1* | 6/2011 | Okada et al. .................... | 257/76 |
| 2013/0175538 A1* | 7/2013 | Choi et al. ...................... | 257/76 |

FOREIGN PATENT DOCUMENTS

| | | |
|---|---|---|
| JP | 2008-53448 A1 | 3/2008 |
| JP | 2008-192701 A1 | 8/2008 |
| JP | 2011-91109 A1 | 5/2011 |

* cited by examiner

*Primary Examiner* — David S Blum
(74) *Attorney, Agent, or Firm* — Kratz, Quintos & Hanson, LLP

(57) ABSTRACT

A semiconductor device includes: an electron-transit layer made of a semiconductor, the electron-transit layer having a first band gap; an electron-supply layer disposed on the electron-transit layer, the electron-supply layer being made of a semiconductor having a second band gap that is wider than the first band gap; a barrier-forming layer disposed on the electron-supply layer, the barrier-forming layer being made of a semiconductor having a third band gap that is narrower than the second band gap; an upper-channel layer disposed on the barrier-forming layer, the upper-channel layer being made of a semiconductor doped with an impurity; a side-surface of the barrier-forming layer and the upper-channel layer formed by partly removing the barrier-forming layer and the upper-channel layer; an insulating-film disposed on the side-surface; a gate-electrode disposed on the insulating-film; a source-electrode connected to the upper-channel layer; and a drain-electrode connected to the electron-supply layer or the electron-transit layer.

20 Claims, 12 Drawing Sheets

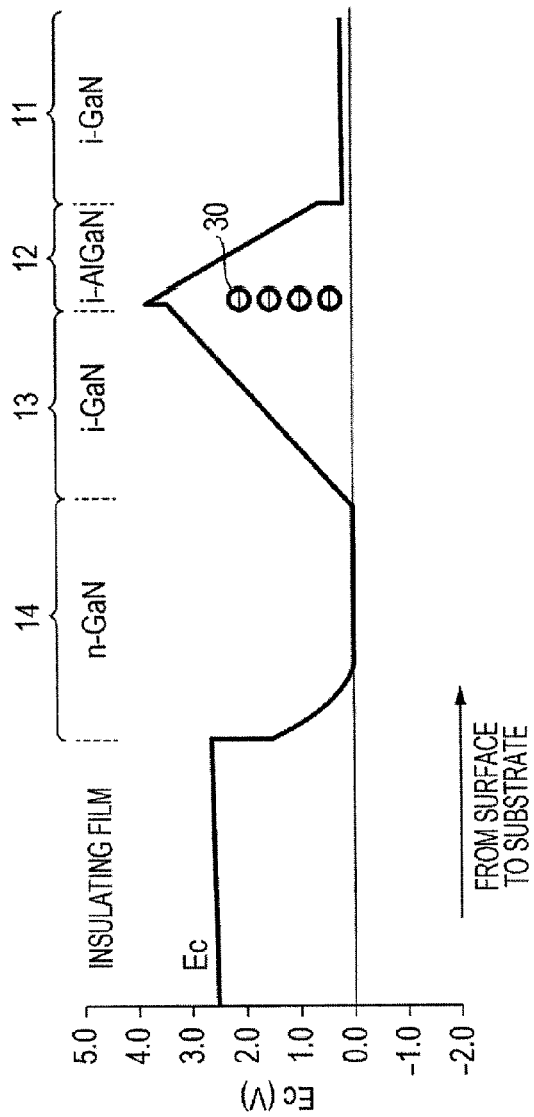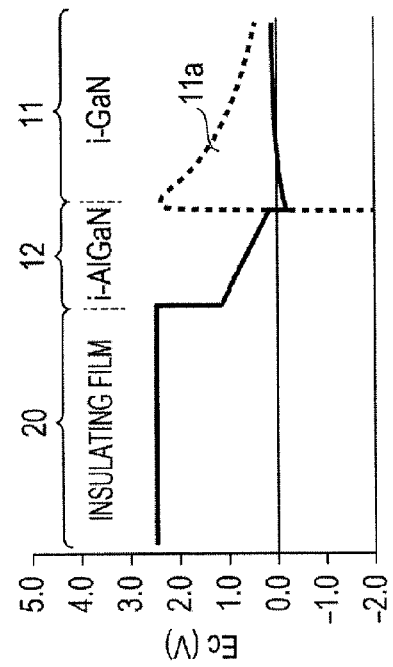
FIG. 2A
FIG. 2B

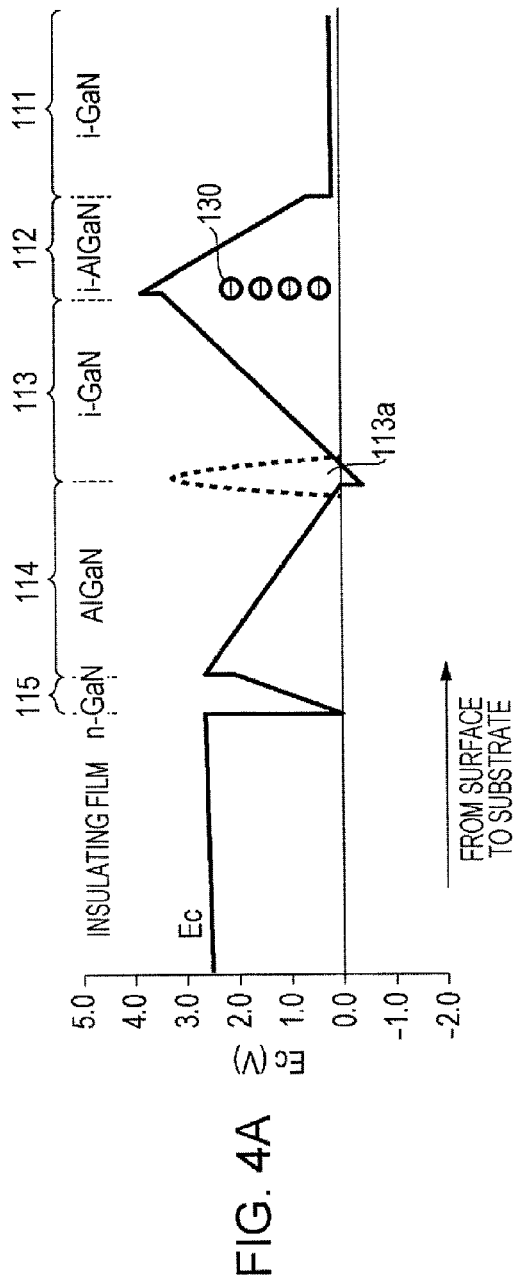
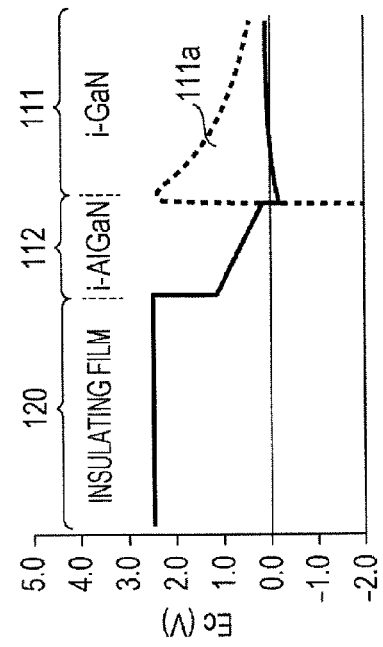
FIG. 4A
FIG. 4B

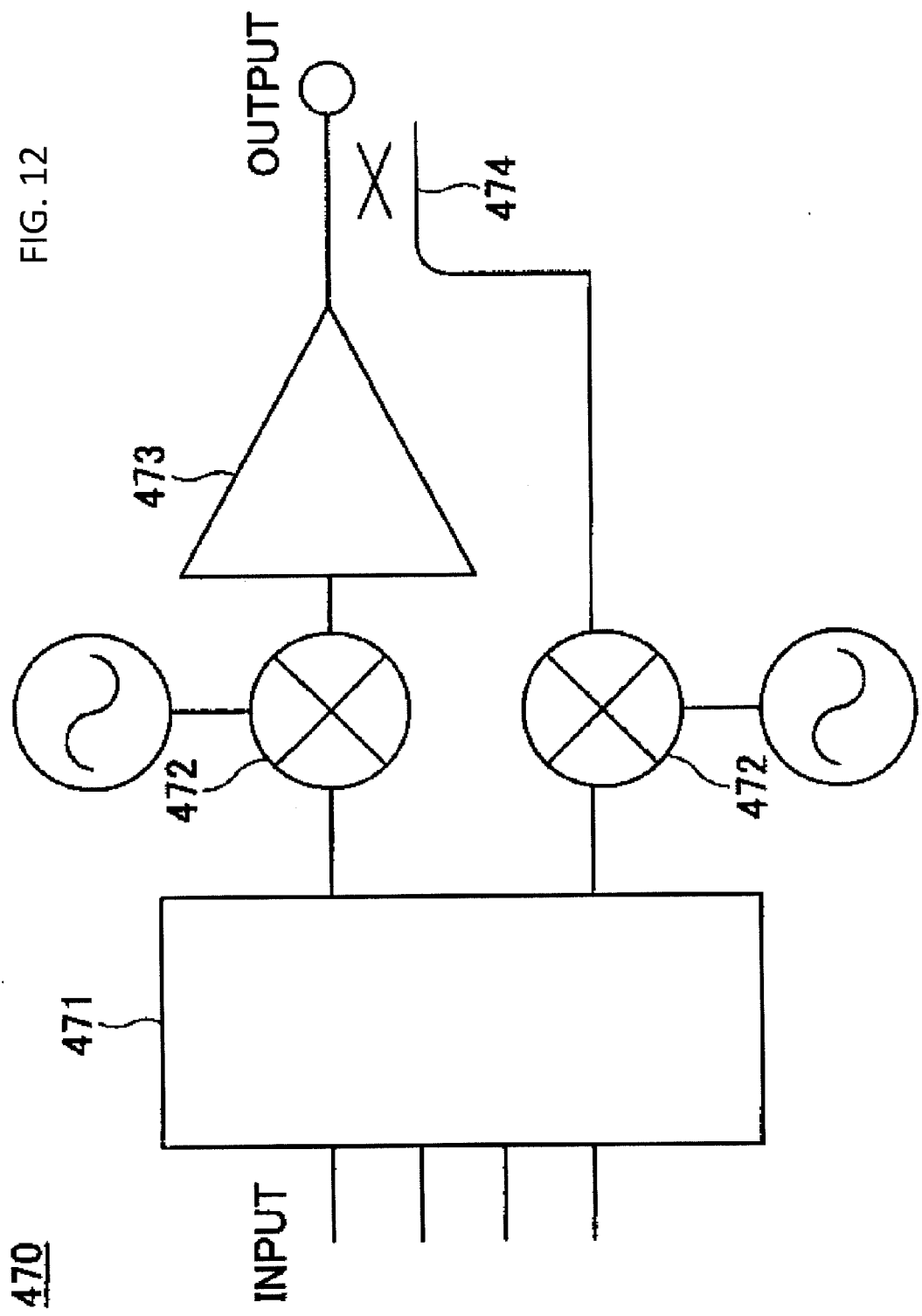

US 8,586,994 B2

SEMICONDUCTOR DEVICE

CROSS-REFERENCE TO RELATED APPLICATION(S)

This application is based upon and claims the benefit of priority of the prior Japanese Patent Application No. 2011-190999, filed on Sep. 1, 2011, the entire contents of which are incorporated herein by reference.

FIELD

The embodiments discussed herein are related to semiconductor devices.

BACKGROUND

One known energy-saving high-voltage semiconductor device is a power transistor that includes a wide band-gap semiconductor. One example of such a wide band-gap semiconductor is GaN. GaN has a band gap of 3.4 eV, which is higher than the band gap of common semiconductor materials Si (1.2 eV) and GaAs (1.4 eV).

A power transistor that includes a wide band-gap semiconductor GaN has a high breakdown voltage, which allows the distance between electrodes and on-resistance to be reduced. Transistors having reduced on-resistance generate less heat and are therefore energy-saving devices.

Present power devices contain Si as a main semiconductor material. Specific examples of such power devices include power transistors, insulated gate bipolar transistors (IGBTs), and cool metal-oxide-semiconductor field-effect transistors (MOSFETs), each containing Si. GaN transistors have on-resistance an order of magnitude lower than that of Si transistors and therefore have potential for high-voltage high-efficiency power devices for use in switching power supplies and electric vehicle inverters.

It is desirable that power transistors for use in switching power supplies not only have low on-resistance but also are capable of normally-off operation, during which no electric current flows unless a control voltage, such as a gate voltage, is applied. Thus, the structure of GaN transistors capable of normally-off operation has been studied. One example of GaN transistors capable of normally-off operation is a vertical metal-insulator-semiconductor field-effect transistor (MISFET) that includes a p-GaN layer.

However, a high concentration of acceptor in a p-GaN layer is difficult to activate. Furthermore, use of a simple GaN bulk layer as an electron transit layer (drift layer) is not achieve high electron mobility, unlike two-dimensional electron gas (2 DEG) in high-electron-mobility transistors (HEMTs). This results in high on-resistance.

One example of vertical GaN-FETs having a normally-off structure without using a p-GaN layer, which has difficulty in activating a high concentration of acceptor, has a GaN/AlGaN heterojunction barrier.

However, even with the GaN/AlGaN heterojunction barrier, use of a GaN bulk layer as an electron transit layer still increases on-resistance.

[Patent Document] Japanese Laid-open Patent Publications No. 2008-192701
[Patent Document] Japanese Laid-open Patent Publications No. 2008-53448
[Patent Document] Japanese Laid-open Patent Publication No. 2011-91109

SUMMARY

According to an aspect of the embodiments, a semiconductor device includes: an electron-transit layer made of a semiconductor, the electron-transit layer having a first band gap; an electron-supply layer disposed on the electron-transit layer, the electron-supply layer being made of a semiconductor having a second band gap that is wider than the first band gap; a barrier-forming layer disposed on the electron-supply layer, the barrier-forming layer being made of a semiconductor having a third band gap that is narrower than the second band gap; an upper-channel layer disposed on the barrier-forming layer, the upper-channel layer being made of a semiconductor doped with an impurity; a side-surface of the barrier-forming layer and the upper-channel layer formed by partly removing the barrier-forming layer and the upper-channel layer; an insulating-film disposed on the side-surface; a gate-electrode disposed on the insulating-film; a source-electrode connected to the upper-channel layer; and a drain-electrode connected to the electron-supply layer or the electron-transit layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are state diagrams of a conduction band edge Ec of the semiconductor device according to the first embodiment.

FIGS. 4A and 4B are state diagrams of a conduction band edge Ec of the semiconductor device according to the second embodiment.

FIG. 12 is a structural drawing of a high-power amplifier according to the sixth embodiment.

DESCRIPTION OF EMBODIMENTS

Figure 1:
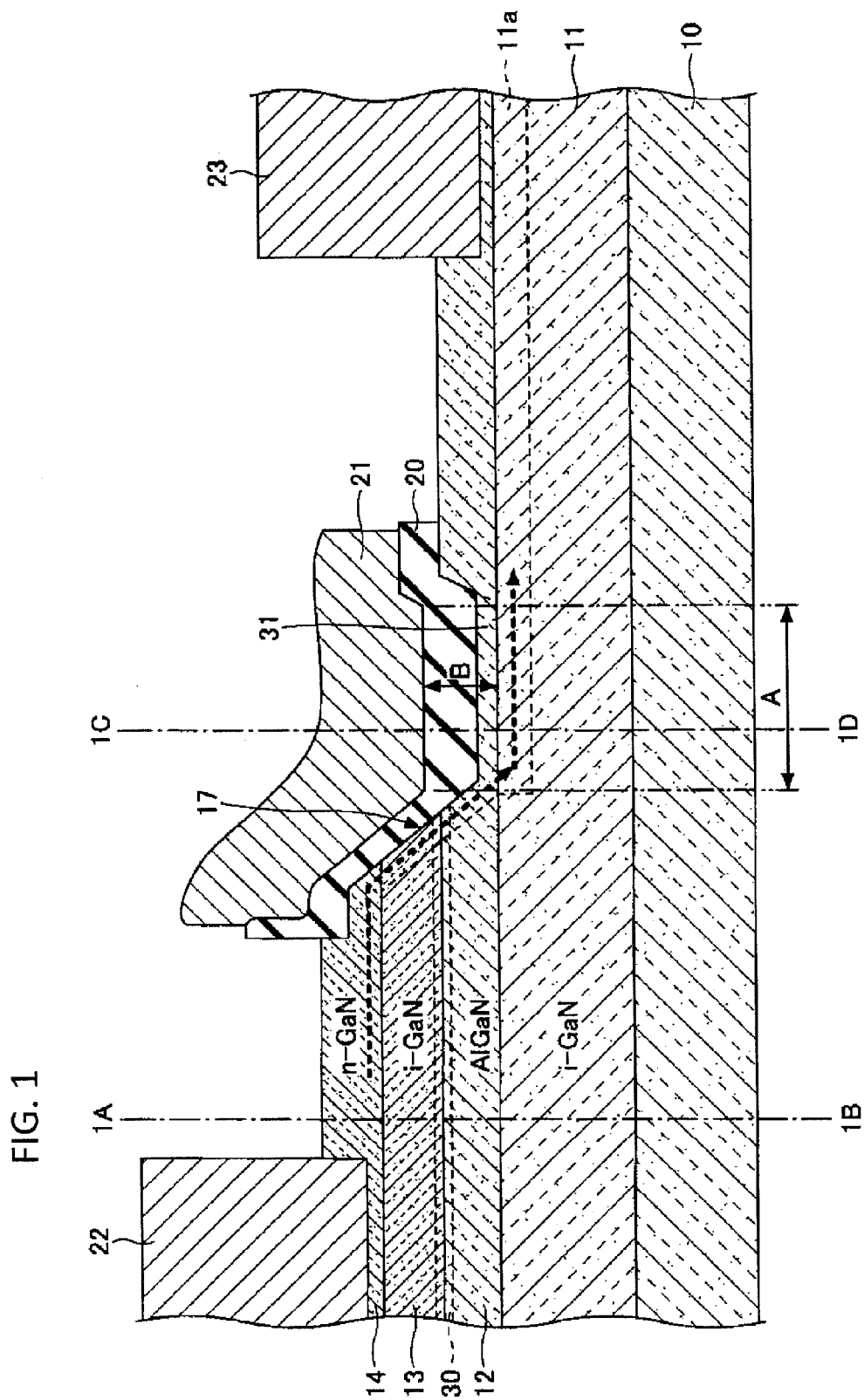
FIG. 1 is a structural drawing of a semiconductor device according to a first embodiment.

Embodiments will be described below. Like parts are designated by like reference numerals and will not be further described.

First Embodiment

Semiconductor Device

A semiconductor device according to a first embodiment will be described below with reference to FIG. 1. The semiconductor device includes, on a substrate 10, an electron transit layer 11 formed of an i-GaN layer, an electron supply layer 12 formed of an AlGaN layer, a barrier-forming layer 13 formed of an i-GaN layer, and an upper channel layer 14 formed of a n-GaN layer. GaN has a band gap of 3.4 eV. The upper channel layer 14, the barrier-forming layer 13, and the electron supply layer 12 are partly removed to form a side surface 17. An insulating film 20 serving as a gate-insulating film is disposed on the processed surface of the electron supply layer 12, the side surface 17, and the processed surface of the upper channel layer 14. A gate electrode 21 is disposed on the insulating film 20. The upper channel layer 14 is connected to a source electrode 22. The electron supply layer 12 is connected to a drain electrode 23.

The semiconductor device further includes a 2 DEG 11a in the electron transit layer 11 adjacent to the electron supply layer 12. The upper channel layer 14 and the barrier-forming layer 13 are removed between the gate electrode 21 and the drain electrode 23 to increase the electron density of the 2 DEG 11a in the electron transit layer 11 thereunder.

The substrate 10 is a semi-insulating SiC substrate and may also be a Si substrate or a sapphire substrate.

The electron transit layer 11 formed of the i-GaN layer has a thickness in the range of 0.1 to 5 μm.

The electron supply layer 12 formed of the AlGaN layer has a thickness in the range of 0.01 to 1 μm, preferably 0.01 to 0.1 μm. The electron supply layer 12 may have a composition of $Al_YGa_{1-Y}N$, wherein Y ranges from 0.1 to 0.4. This composition gives a band gap in the range of 3.7 to 4.5 eV. The electron supply layer 12 may be of an n type doped with an impurity element, such as Si, or may be undoped. The electron supply layer 12 is made of undoped i-AlGaN and may have a composition of $Al_{0.25}Ga_{0.75}N$ (Y=0.25), which gives a band gap of approximately 4.2 eV.

The barrier-forming layer 13 formed of the i-GaN layer has a thickness of approximately 0.1 μm. The barrier-forming layer 13 formed of the i-GaN layer preferably has a thickness of 20 nm or more.

The upper channel layer 14 formed of the n-GaN layer has a thickness in the range of 0.01 to 1 μm, preferably 0.05 to 0.2 μm, and is doped with $1\times10^{17}$ to $1\times10^{19}$ cm$^{-3}$ of Si. The upper channel layer 14 formed of the n-GaN layer has a thickness of approximately 0.1 μm and is doped with approximately $2\times10^{18}$ cm$^{-3}$ of Si.

The electron transit layer 11 and the barrier-forming layer 13 may be formed of i-AlGaN, and the upper channel layer 14 may be formed of n-AlGaN. The electron transit layer 11, the barrier-forming layer 13, and the upper channel layer 14 may have a composition of $Al_XGa_{1-X}N$, and the electron supply layer 12 may have a composition of $Al_YGa_{1-Y}N$, wherein X and Y satisfy $0 \leq X < Y \leq 1$.

The insulating film 20 is formed of a dielectric material, such as silicon nitride (SiN), silicon oxide ($SiO_2$), silicon oxynitride (SiON), aluminum nitride (AlN), aluminum oxide ($Al_2O_3$), aluminum oxynitride (AlON), tantalum oxide ($Ta_2O_5$), hafnium oxide ($HfO_2$), or a ferroelectric material such as lead zirconate titanate ($PbZrTiO_3$), or a combination thereof.

The source electrode 22 and the drain electrode 23 are made of Ti/Al. The source electrode 22 is in ohmic contact with the upper channel layer 14 formed of the n-GaN layer, and the drain electrode 23 is in ohmic contact with the electron supply layer 12 formed of the AlGaN layer.

The 2 DEG 11a is disposed adjacent to the electron supply layer 12 between a portion of the electron transit layer 11 under the gate electrode 21 and a portion of the electron transit layer 11 under the drain electrode 23. Negative fixed charges 30 resulting from polarization charges and piezoelectric charges occur between the electron supply layer 12 and the barrier-forming layer 13. The negative fixed charges 30 act as a potential barrier. When no voltage is applied to the gate electrode 21 in a common-source configuration, the potential barrier blocks electrons flowing between the upper channel layer 14 and the 2 DEG 11a to cause an off state. This may cause normally-off operation.

Upon the application of a positive voltage on the gate electrode 21, electrons are induced in a region 31 of the electron supply layer 12 and the barrier-forming layer 13 in contact with the insulating film 20 including the side surface 17. The induced electrons allow the upper channel layer 14 to be connected to the 2 DEG 11a, causing an on state. Thus, the application of a positive voltage on the gate electrode 21 allows electrons to flow from the upper channel layer 14 to the 2 DEG 11a in the electron transit layer 11 through the barrier-forming layer 13 and the electron supply layer 12. A portion of the upper channel layer 14 between the gate electrode 21 and the source electrode 22 and a portion of the 2 DEG 11a in the electron transit layer 11 under the gate electrode 21 serve as electron transit channels.

The width A of the gate electrode 21 illustrated in FIG. 1 is at least twice the distance B between the gate electrode 21 and the 2 DEG 11a. Even when a high voltage is applied to the drain electrode 23, such a structure allows an electric field from the drain electrode 23 to be concentrated on an edge of the gate electrode 21 facing the drain electrode 23. This may reduce the influence of a high drain voltage, for example, an increase in drain conductance (a short channel effect). The application of a positive voltage on the gate electrode 21 to cause the on state may also increase the electron concentration of the 2 DEG 11a under the gate electrode 21 and thereby reduce on-resistance.

The insulating film 20 may be disposed on the upper channel layer 14 between the gate electrode 21 and the source electrode 22 or on the electron supply layer 12 between the gate electrode 21 and the drain electrode 23. The insulating film 20 may function as a protective film. An i-GaN layer having a smaller thickness than the barrier-forming layer 13 formed of the i-GaN layer, for example, 5 nm or less, may be disposed on the electron supply layer 12 between the gate electrode 21 and the drain electrode 23. Such a thin i-GaN layer does not significantly reduce the electron density of the 2 DEG 11a.

The conduction band edge Ec of the semiconductor device according to the present embodiment will be described below with reference to FIGS. 2A and 2B. FIG. 2A illustrates the conduction band edge Ec along an alternate long and short dashed line 1A-1B between the gate electrode 21 and the source electrode 22 in FIG. 1. FIG. 2B illustrates the conduction band edge Ec along an alternate long and short dashed line 1C-1D passing through the gate electrode 21 in FIG. 1. The result illustrated in FIG. 2A was obtained with the semiconductor device that included an insulating film disposed on the upper channel layer 14 between the gate electrode 21 and the source electrode 22.

As illustrated in FIG. 2A, the negative fixed charges 30 resulting from polarization charges and piezoelectric charges occur between the electron supply layer 12 formed of the AlGaN layer and the barrier-forming layer 13 formed of the i-GaN layer. When no voltage is applied to the gate electrode 21 in a common-source configuration, a potential barrier caused by the negative fixed charges 30 blocks electrons flowing between the upper channel layer 14 formed of the n-GaN layer and the electron supply layer 12 formed of the AlGaN layer.

As illustrated in FIG. 2B, the upper channel layer 14 formed of the n-GaN layer, the barrier-forming layer 13 formed of the i-GaN layer, and the electron supply layer 12 formed of the AlGaN layer are removed under the gate electrode 21. This allows the 2 DEG 11a having a relatively high electron density to be formed in the electron transit layer 11 formed of the i-GaN layer adjacent to the electron supply layer 12.

Method for Manufacturing Semiconductor Device

A method for manufacturing a semiconductor device according to the present embodiment will be described below with reference to FIG. 1.

First, a buffer layer (not shown) made of AlN and semiconductor layers, such as the electron transit layer 11 formed of the i-GaN layer, the electron supply layer 12 formed of the AlGaN layer, the barrier-forming layer 13 formed of the i-GaN layer, and the upper channel layer 14 formed of the n-GaN layer, are formed on the substrate 10. The semiconductor layers are epitaxially grown by metal-organic chemical vapor deposition (MOCVD). The substrate 10 is a semi-insulating SiC substrate and may also be a Si substrate or a sapphire substrate.

In the formation of the semiconductor layers by MOCVD, the source gases may be $NH_3$ for N, trimethylaluminum (TMA) for Al, and trimethylgallium (TMG) for Ga. The n-type impurity element is Si, and the source gas for Si is silane ($SiH_4$). The electron supply layer 12 may be an InAlN layer instead of the AlGaN layer. The source gas for In is trimethylindium (TMI).

The upper channel layer 14 and the barrier-forming layer 13 are removed between a region for forming the gate electrode 21 and a region for forming the drain electrode 23. The upper channel layer 14, the barrier-forming layer 13, and the electron supply layer 12 are removed in the region for forming the gate electrode 21 and the region for forming the drain electrode 23.

More specifically, a photoresist is applied to the upper channel layer 14, is exposed to light from an exposure apparatus, and is developed to form a resist pattern that has an opening corresponding to portions of the upper channel layer 14 and the barrier-forming layer 13 to be removed. The portions of the upper channel layer 14 and the barrier-forming layer 13 to be removed is then removed by dry etching, such as reactive ion etching (RIE).

Portions of the electron supply layer 12 corresponding to the gate electrode 21 and the drain electrode 23 are then removed. More specifically, a photoresist is applied to the upper channel layer 14 and the electron supply layer 12, is exposed to light from an exposure apparatus, and is developed to form a resist pattern that has an opening corresponding to a portion of the electron supply layer 12 to be removed. The portion of the electron supply layer 12 to be removed is then removed by dry etching, such as RIE. Thus, the upper channel layer 14, the barrier-forming layer 13, and the electron supply layer 12 may be partly removed by etching to form the side surface 17 on the upper channel layer 14, the barrier-forming layer 13, and the electron supply layer 12.

A surface damaged by dry etching is then removed, for example, by wet etching with an aqueous tetramethylammonium (TMAH), to clean the side surface 17 and the etched surface.

The insulating film 20 is then formed on the side surface 17 and the etched surface of the electron supply layer 12. The insulating film 20 is formed of a dielectric material, such as silicon nitride, silicon oxide, silicon oxynitride, aluminum nitride, aluminum oxide, aluminum oxynitride, tantalum oxide, hafnium oxide, or a ferroelectric material such as lead zirconate titanate, or a combination thereof. The insulating film 20 may be formed by atomic layer deposition (ALD). The insulating film 20 may also be formed by chemical vapor deposition (CVD) or sputtering. The insulating film 20 has a thickness in the range of 10 to 100 nm.

The gate electrode 21, the source electrode 22, and the drain electrode 23 are then formed. The gate electrode 21 is disposed on the insulating film 20 on top of the electron supply layer 12 and the side surface 17. The gate electrode 21 may be made of Ni/Au. The gate electrode 21 may be formed by forming a resist pattern having an opening corresponding to the gate electrode 21, depositing a Ni/Au metal film by vacuum evaporation, and lifting off the resist pattern with an organic solvent.

After removing an insulating film (not shown) on a portion of the upper channel layer 14 corresponding to the source electrode 22, the source electrode 22 is formed so as to be connected to the upper channel layer 14. Alternatively, the upper channel layer 14 may be partly removed to form the source electrode 22 thereon.

After part or all of the insulating film (not shown) and the electron supply layer 12 corresponding to the drain electrode 23 are removed, the drain electrode 23 is formed so as to be connected to the electron supply layer 12 or the electron transit layer 11. Thus, the drain electrode 23 is connected to the 2 DEG 11a.

The source electrode 22 and the drain electrode 23 may be made of Ti/Al. The source electrode 22 and the drain electrode 23 may be formed by forming a resist pattern having openings corresponding to the source electrode 22 and the drain electrode 23, depositing a Ti/Al metal film by vacuum evaporation, and lifting off the resist pattern with an organic solvent.

In this way, a field-effect transistor, which is a semiconductor device according to the present embodiment, may be manufactured. The semiconductor device according to the present embodiment may be manufactured by another method. The semiconductor device according to the present embodiment, that is, the field-effect transistor has low on-resistance and is capable of normally-off operation and may therefore be used in various applications, such as switching power supplies and electric vehicle inverters.

Second Embodiment

Semiconductor Device

A semiconductor device according to a second embodiment will be described below with reference to FIG. 3. The semiconductor device includes, on a substrate 110, an electron transit layer 111 formed of an i-GaN layer, an electron supply layer 112 formed of an AlGaN layer, an upper electron transit layer 113 formed of an i-GaN layer, an upper electron supply layer 114 formed of an AlGaN layer, and a cap layer 115 formed of a GaN layer. GaN has a band gap of 3.4 eV. The cap layer 115, the upper electron supply layer 114, the upper electron transit layer 113, and the electron supply layer 112 are partly removed to form a side surface 117. An insulating film 120 serving as a gate-insulating film is disposed on the processed surface of the electron supply layer 112, the side surface 117, and the cap layer 115. The gate electrode 121 is disposed on the insulating film 120 on top of the electron supply layer 112 and the side surface 117. A source electrode 122 is connected to the upper electron supply layer 114. The drain electrode 123 is connected to the electron supply layer 112.

The semiconductor device further includes a 2 DEG 111*a* in the electron transit layer 111 adjacent to the electron supply layer 112 and a 2 DEG 113*a* in the upper electron transit layer 113 adjacent to the upper electron supply layer 114. The cap layer 115, the upper electron supply layer 114, and the upper electron transit layer 113 are removed between the gate electrode 121 and the drain electrode 123 to increase the electron density of the 2 DEG 111*a* in the electron transit layer 111 thereunder. The electron transit layer 111 may also be referred to as a first electron transit layer, the electron supply layer 112 may also be referred to as a first electron supply layer, the upper electron transit layer 113 may also be referred to as a second electron transit layer, and the upper electron supply layer 114 may also be referred to as a second electron supply layer.

The substrate 110 is a semi-insulating SiC substrate and may also be a Si substrate or a sapphire substrate.

The electron transit layer 111 formed of the i-GaN layer has a thickness in the range of 0.1 to 5

The electron supply layer 112 formed of the AlGaN layer has a thickness in the range of 0.01 to 1 preferably 0.01 to 0.1 The electron supply layer 112 may have a composition of $Al_YGa_{1-Y}N$, wherein Y ranges from 0.1 to 0.4. This composition gives a band gap in the range of 3.7 to 4.5 eV. The electron supply layer 112 may be of an n type doped with an impurity element, such as Si, or may be undoped. The electron supply layer 112 is formed of undoped i-AlGaN and may have a composition of $Al_{0.25}Ga_{0.75}N (Y=0.25)$, which gives a band gap of approximately 4.2 eV.

The upper electron transit layer 113 formed of the i-GaN layer has a thickness of approximately 60 nm. The upper electron transit layer 113 formed of the i-GaN layer preferably has a thickness in the range of 0.05 to 0.2 μm. The upper electron transit layer 113 may function as a barrier-forming layer; an interface between the upper electron transit layer 113 and the electron supply layer 112 forms a potential barrier of fixed charges.

The upper electron supply layer 114 formed of the AlGaN layer has a thickness in the range of 0.01 to 1 μm, preferably 0.01 to 0.1 μm. The upper electron supply layer 114 may have a composition of $Al_YGa_{1-Y}N$, wherein Y ranges from 0.1 to 0.4. This composition gives a band gap in the range of 3.7 to 4.5 eV. The upper electron supply layer 114 may be of an n type doped with an impurity element, such as Si, or may be undoped. The upper electron supply layer 114 is formed of undoped i-AlGaN and may have a composition of $Al_{0.25}Ga_{0.75}N (Y=0.25)$.

The cap layer 115 formed of the GaN layer has a thickness in the range of 0.01 to 1 μm and is formed of i-GaN or n-GaN.

The electron transit layer 111 and the upper electron transit layer 113 may be formed of i-AlGaN. The electron transit layer 111 and the upper electron transit layer 113 may have a composition of $Al_XGa_{1-X}N$, and the electron supply layer 112 and the upper electron supply layer 114 may have a composition of $Al_YGa_{1-Y}N$, wherein X and Y satisfy $0X<Y \le 1$.

The insulating film 120 is formed of a dielectric material, such as silicon nitride (SiN), silicon oxide ($SiO_2$), silicon oxynitride (SiON), aluminum nitride (AlN), aluminum oxide ($Al_2O_3$), aluminum oxynitride (AlON), tantalum oxide ($Ta_2O_5$), hafnium oxide ($HfO_2$), or a ferroelectric material such as lead zirconate titanate ($PbZrTiO_3$), or a combination thereof.

The source electrode 122 and the drain electrode 123 are made of Ti/Al. The source electrode 122 is in ohmic contact with the upper electron supply layer 114 formed of the AlGaN layer, and the drain electrode 123 is in ohmic contact with the electron supply layer 112 formed of the AlGaN layer.

The 2 DEG 111*a* is disposed adjacent to the electron supply layer 112 between a portion of the electron transit layer 111 under the gate electrode 121 and a portion of the electron transit layer 111 under the drain electrode 123. The 2 DEG 113*a* is formed in the upper electron transit layer 113 adjacent to the upper electron supply layer 114 from under the source electrode 122 to the vicinity of the gate electrode 121. Negative fixed charges 130 resulting from polarization charges and piezoelectric charges occur between the electron supply layer 112 and the upper electron transit layer 113. The negative fixed charges 130 act as a potential barrier. When no voltage is applied to the gate electrode 121 in a common-source configuration, the potential barrier blocks electrons flowing between the 2 DEG 113*a* in the upper electron transit layer 113 and the 2 DEG 111*a* in the electron transit layer 111, causing an off state. This may cause normally-off operation.

Upon the application of a positive voltage on the gate electrode 121, electrons are induced in a region 131 of the electron supply layer 112 and the upper electron transit layer 113 in contact with the insulating film 120 including the side surface 117. The induced electrons allow the 2 DEG 113*a* in the upper electron transit layer 113 to be connected to the 2 DEG 111*a* in the electron transit layer 111, causing an ON state. Thus, the application of a positive voltage on the gate electrode 121 allows electrons to flow from the 2 DEG 113*a* in the upper electron transit layer 113 to the 2 DEG 111*a* in the electron transit layer 111 through the upper electron transit layer 113 and the electron supply layer 112. The 2 DEG 113*a* in the upper electron transit layer 113 between the gate electrode 121 and the source electrode 122 serves as an electron transit channel, and the 2 DEG 111*a* in the electron transit layer 111 under the gate electrode 121 also serves as an electron transit channel.

Figure 3:
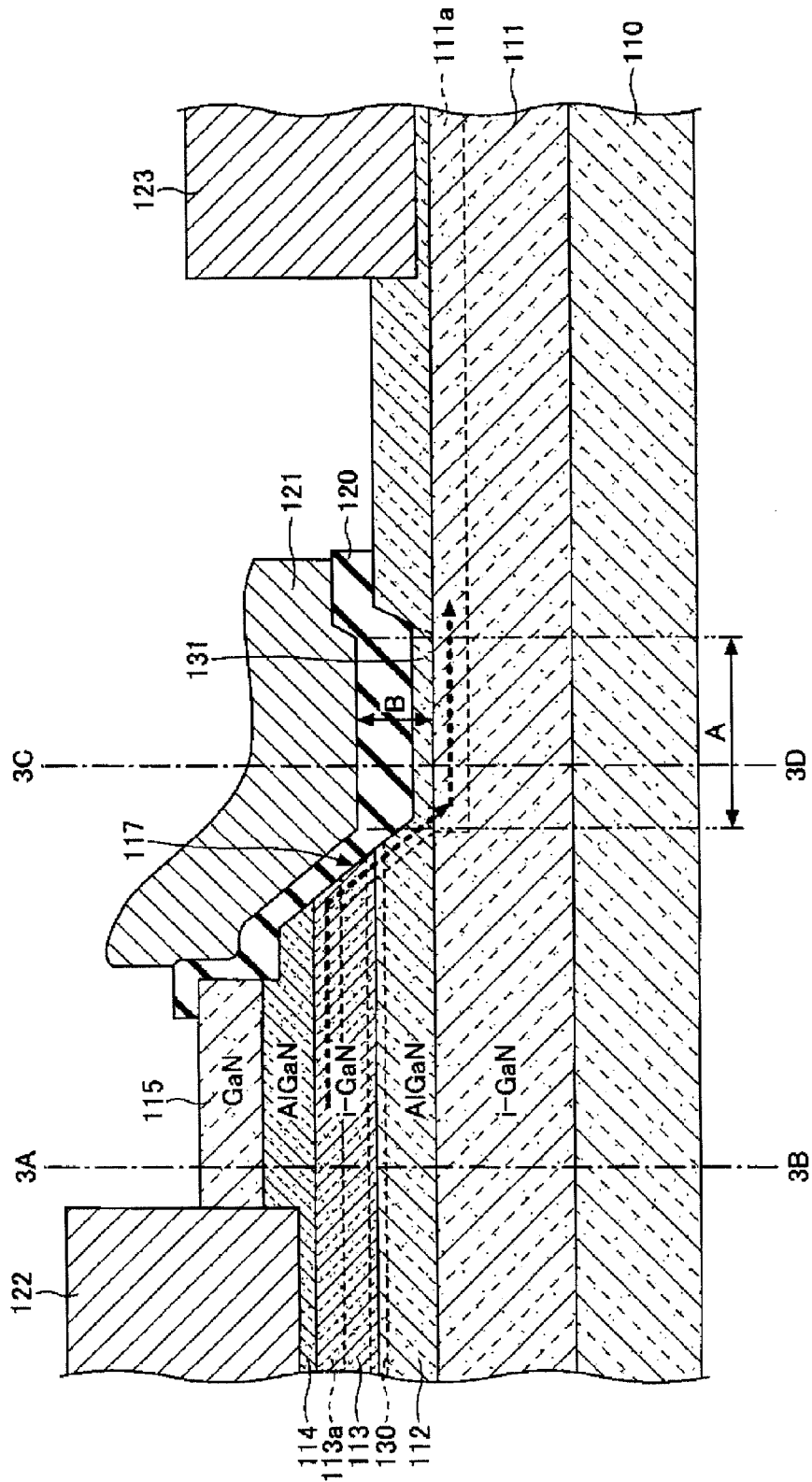
FIG. 3 is a structural drawing of a semiconductor device according to a second embodiment.

The width A of the gate electrode 121 illustrated in FIG. 3 is at least twice the distance B between the gate electrode 121 and the 2 DEG 111*a*. Even when a high voltage is applied to the drain electrode 123, such a structure allows an electric field from the drain electrode 123 to be concentrated on an edge of the gate electrode 121 facing the drain electrode 123. This may reduce the influence of a high drain voltage, for example, an increase in drain conductance (a short channel effect). The application of a positive voltage on the gate electrode 121 to cause the on state may also increase the electron concentration of the 2 DEG 111*a* under the gate electrode 121 and thereby reduce on-resistance.

The insulating film 120 may be disposed on the cap layer 115 between the gate electrode 121 and the source electrode 122 or on the electron supply layer 112 between the gate electrode 121 and the drain electrode 123. The insulating film 120 may function as a protective film. An i-GaN layer having a smaller thickness than the upper electron transit layer 113 formed of the i-GaN layer, for example, 5 nm or less, may be disposed on the electron supply layer 112 between the gate electrode 121 and the drain electrode 123. Such a thin i-GaN layer does not significantly reduce the electron density of the 2 DEG 111*a*.

The conduction band edge Ec of the semiconductor device according to the present embodiment will be described below with reference to FIGS. 4A and 4B. FIG. 4A illustrates the conduction band edge Ec along an alternate long and short dashed line 3A-3B between the gate electrode 121 and the source electrode 122 in FIG. 3. FIG. 4B illustrates the conduction band edge Ec along an alternate long and short dashed line 3C-3D passing through the gate electrode 121 in FIG. 3. The result illustrated in FIG. 4A was obtained with the semiconductor device that included an insulating film disposed on the cap layer 115 between the gate electrode 121 and the source electrode 122.

As illustrated in FIG. 4A, the negative fixed charges 130 resulting from polarization charges and piezoelectric charges occur between the electron supply layer 112 formed of the AlGaN layer and the upper electron transit layer 113 formed of the i-GaN layer. When no voltage is applied to the gate electrode 121 in a common-source configuration, a potential barrier caused by the negative fixed charges 130 blocks electrons flowing between the 2 DEG 113a in the upper electron transit layer 113 and the 2 DEG 111a in the electron transit layer 111.

As illustrated in FIG. 4B, the cap layer 115, the upper electron supply layer 114 formed of the AlGaN layer, the upper electron transit layer 113 formed of the i-GaN layer, and the electron supply layer 112 formed of the AlGaN layer are removed under the gate electrode 121. This allows the 2 DEG 111a having a relatively high electron density to be formed in the electron transit layer 111 formed of the i-GaN layer adjacent to the electron supply layer 112.

Method for Manufacturing Semiconductor Device

A method for manufacturing a semiconductor device according to the present embodiment will be described below with reference to FIG. 3.

First, a semiconductor layer is epitaxially grown on the substrate 110 by metal-organic chemical vapor deposition. More specifically, a buffer layer (not shown) made of AlN, the electron transit layer 111 formed of the i-GaN layer, the electron supply layer 112 formed of the AlGaN layer, the upper electron transit layer 113 formed of the i-GaN layer, the upper electron supply layer 114 formed of the AlGaN layer, and the cap layer 115 are formed on the substrate 110. The substrate 110 is a semi-insulating SiC substrate and may also be a Si substrate or a sapphire substrate.

In the formation of the semiconductor layers by MOCVD, the source gases may be $NH_3$ for N, trimethylaluminum (TMA) for Al, and trimethylgallium (TMG) for Ga. The n-type impurity element is Si, and the source gas for Si is silane ($SiH_4$). The electron supply layer 112 may be an InAlN layer instead of the AlGaN layer. The source gas for In is trimethylindium (TMI).

The cap layer 115, the upper electron supply layer 114, and the upper electron transit layer 113 are removed between a region for forming the gate electrode 121 and a region for forming the drain electrode 123. The cap layer 115, the upper electron supply layer 114, the upper electron transit layer 113, and the electron supply layer 112 are removed in the region for forming the gate electrode 121 and the region for forming the drain electrode 123.

More specifically, a photoresist is applied to the cap layer 115, is exposed to light from an exposure apparatus, and is developed to form a resist pattern that has an opening corresponding to portions of the cap layer 115, the upper electron supply layer 114, and the upper electron transit layer 113 to be removed. The portions of the cap layer 115, the upper electron supply layer 114, and the upper electron transit layer 113 to be removed is then removed by dry etching, such as RIE.

Portions of the electron supply layer 112 corresponding to the gate electrode 121 and the drain electrode 123 are then removed. More specifically, a photoresist is applied to the cap layer 115 and the electron supply layer 112, is exposed to light from an exposure apparatus, and is developed to form a resist pattern that has an opening corresponding to a portion of the electron supply layer 112 to be removed. The portion of the electron supply layer 112 to be removed is then removed by dry etching, such as RIE. Thus, the upper electron supply layer 114, the upper electron transit layer 113, and the electron supply layer 112 may be partly removed by etching to form the side surface 117 on the upper electron supply layer 114, the upper electron transit layer 113, and the electron supply layer 112.

A surface damaged by dry etching is then removed, for example, by wet etching with an aqueous tetramethylammonium (TMAH) to clean the side surface 117 and the etched surface.

The insulating film 120 is then formed on the side surface 117 and the etched surface of the electron supply layer 112. The insulating film 120 is formed of a dielectric material, such as silicon nitride, silicon oxide, silicon oxynitride, aluminum nitride, aluminum oxide, aluminum oxynitride, tantalum oxide, hafnium oxide, or a ferroelectric material such as lead zirconate titanate, or a combination thereof. The insulating film 120 may be formed by ALD. The insulating film 120 may also be formed by CVD or sputtering. The insulating film 120 has a thickness in the range of 20 to 100 nm.

The gate electrode 121, the source electrode 122, and the drain electrode 123 are then formed. The gate electrode 121 is disposed on the insulating film 120 on top of the electron supply layer 112 and the side surface 117. The gate electrode 121 may be made of Ni/Au. The gate electrode 121 may be formed by forming a resist pattern having an opening corresponding to the gate electrode 121, depositing a Ni/Au metal film by vacuum evaporation, and lifting off the resist pattern with an organic solvent.

After part or all of the insulating film (not shown), the cap layer 115, and the upper electron supply layer 114 corresponding to the source electrode 122 are removed, the source electrode 122 is formed so as to be connected to the upper electron supply layer 114 or the upper electron transit layer 113. Thus, the source electrode 122 is connected to the 2 DEG 113a.

After part or all of the insulating film (not shown) and the electron supply layer 112 corresponding to the drain electrode 123 are removed, the drain electrode 123 is formed so as to be connected to the electron supply layer 112 or the electron transit layer 111. Thus, the drain electrode 123 is connected to the 2 DEG 111a.

The source electrode 122 and the drain electrode 123 may be made of Ti/Al. The source electrode 122 and the drain electrode 123 may be formed by forming a resist pattern having openings corresponding to the source electrode 122 and the drain electrode 123, depositing a Ti/Al metal film by vacuum evaporation, and lifting off the resist pattern with an organic solvent.

In this way, a field-effect transistor, which is a semiconductor device according to the present embodiment, may be manufactured. The semiconductor device according to the present embodiment may be manufactured by another method.

The 2 DEG 113a caused by polarization charges and piezoelectric polarization occurs in the upper electron transit layer 113 adjacent to the upper electron supply layer 114. The electron mobility in the 2 DEG 113a is as high as approximately 1500 cm/V/s, which may further reduce on-resistance.

Figure 5A:
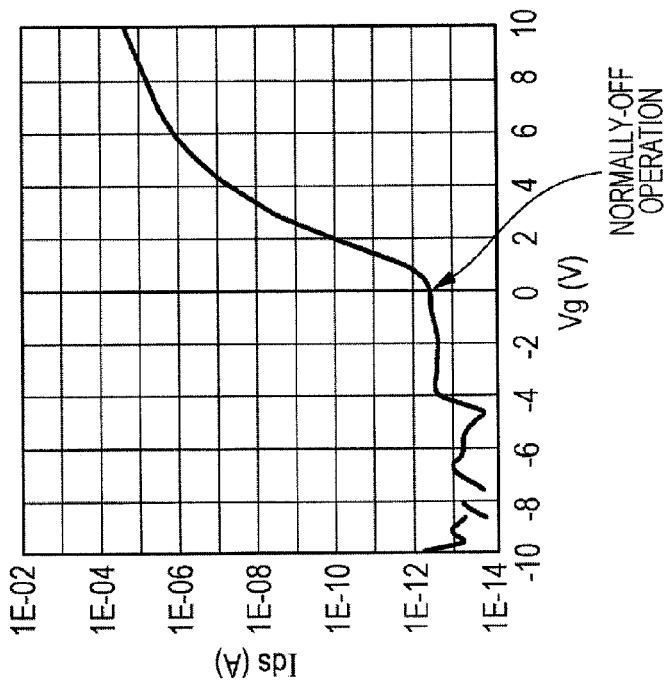
FIGS. 5A and 5B are graphs of certain electrical characteristics of the semiconductor device according to the second embodiment.
Figure 5B:
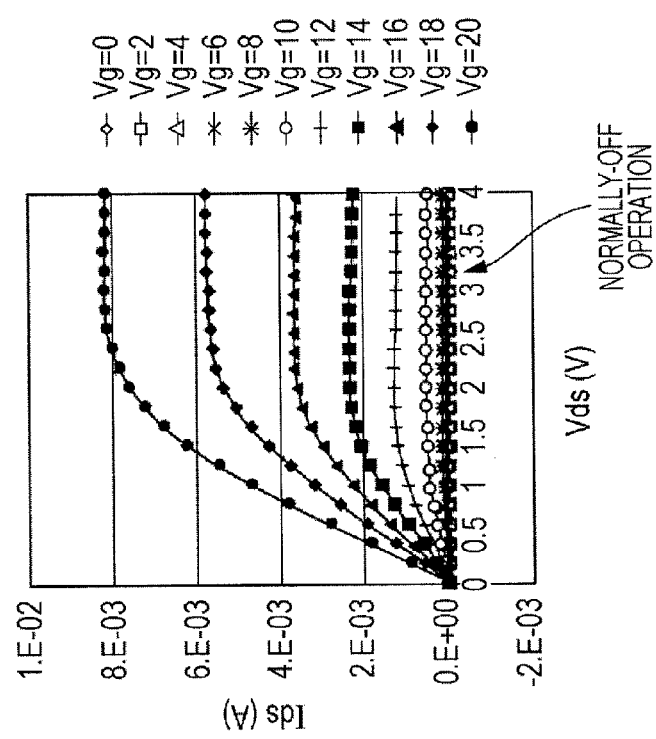

FIGS. 5A and 5B are graphs of certain characteristics of a semiconductor device according to the present embodiment, that is, a field-effect transistor. FIG. 5A is a graph of drain current-drain voltage (Ids-Vds) curves. FIG. 5B is a graph of a drain current-gate voltage (Ids-Vg) curves. The semiconductor device according to the present embodiment, that is, the field-effect transistor may achieve satisfactory normally-off operation.

Other details are as described in the first embodiment.

Third Embodiment

Figure 6:
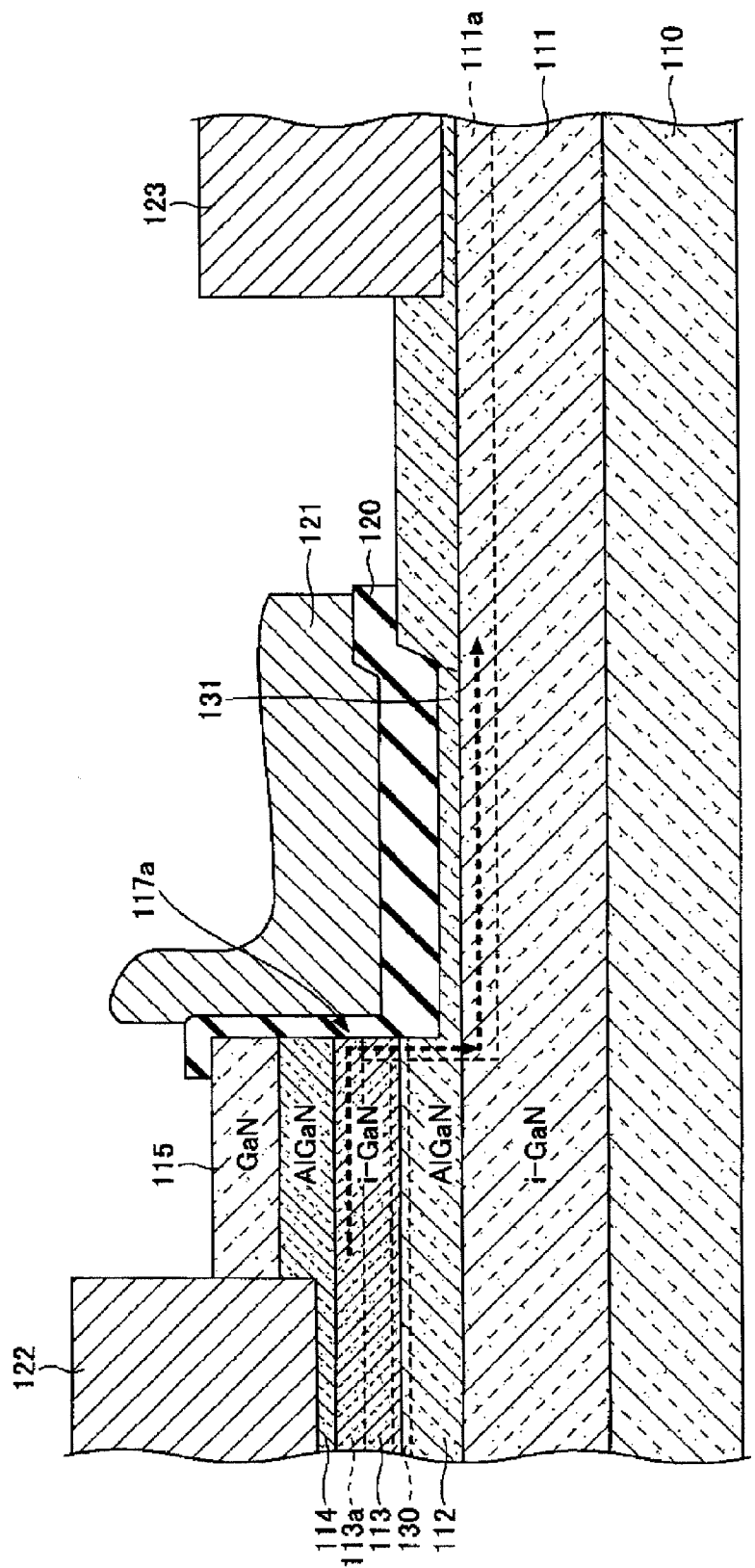
FIG. 6 is a structural drawing of a semiconductor device according to a third embodiment.

A third embodiment will be described below. A semiconductor device according to the present embodiment has the same structure as the semiconductor device according to the second embodiment except that the inclination of the side surface 117 is substantially vertical. A semiconductor device according to the present embodiment will be described below with reference to FIG. 6.

In the semiconductor device according to the present embodiment, the cap layer 115, the upper electron supply layer 114, the upper electron transit layer 113, and the electron supply layer 112 are etched substantially perpendicularly to the substrate 110 to form a steep side surface 117a. Such a steep side surface 117a may be formed by optimizing the conditions for dry etching, such as RIE.

It is known that an inclined side surface as in the second embodiment retains positive fixed charges, but a steep side surface as in the present embodiment retains few electric charges. Thus, the formation of the steep side surface 117a may reduce electric charges and shift the gate voltage to the plus side. This may reduce the leakage current while no gate voltage is applied and reduce unrequested on-state current caused by switching noise.

Other details are as described in the second embodiment. The present embodiment may be applied to the first embodiment.

Fourth Embodiment

A fourth embodiment will be described below. A semiconductor device according to the present embodiment has the same structure as the semiconductor device according to the second embodiment except that a two-dimensional hole gas (2DHG) is formed between the electron supply layer 112 and the upper electron transit layer 113.

Figure 7:
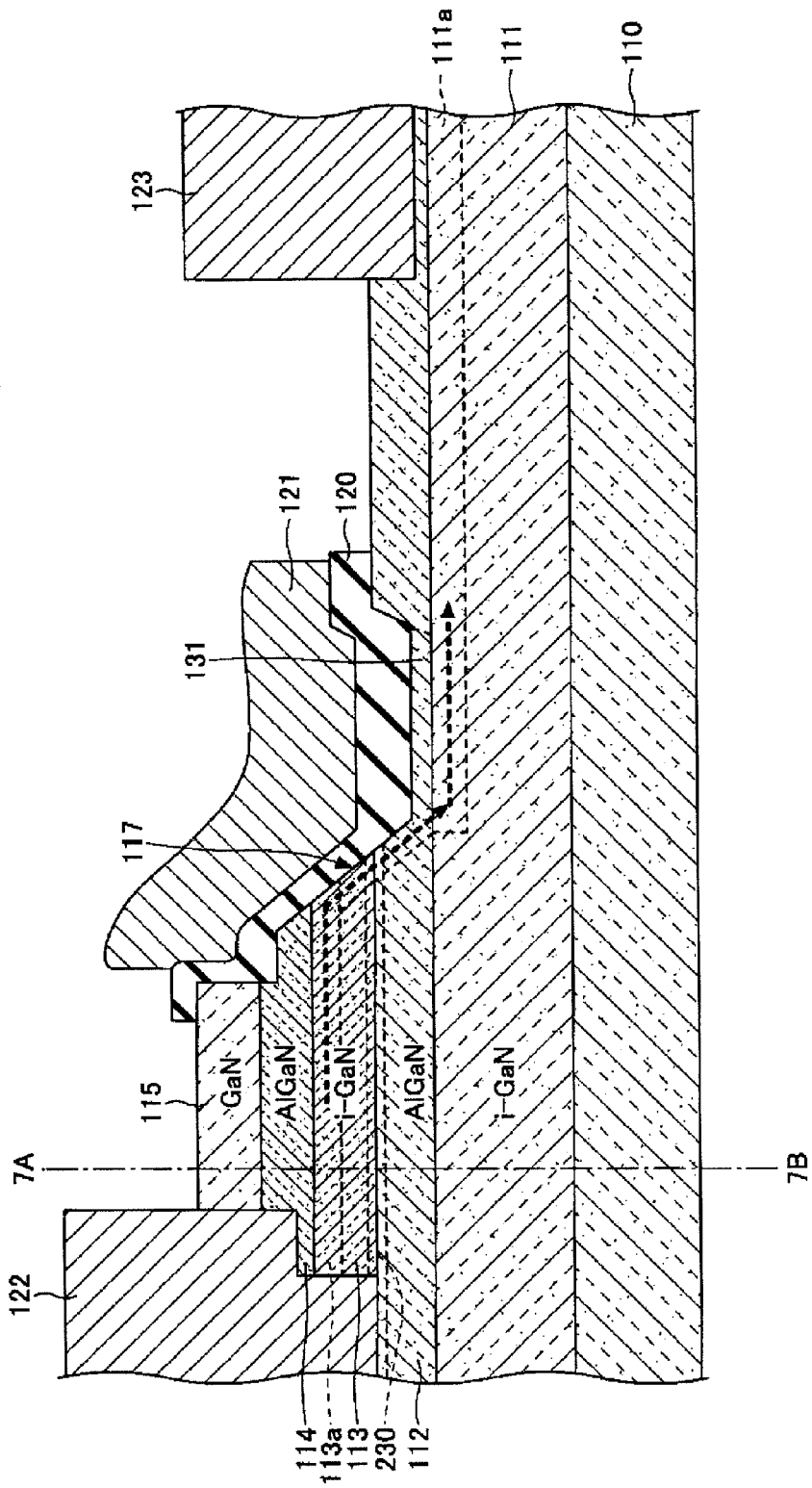
FIG. 7 is a structural drawing of a semiconductor device according to a fourth embodiment.
Figure 8:
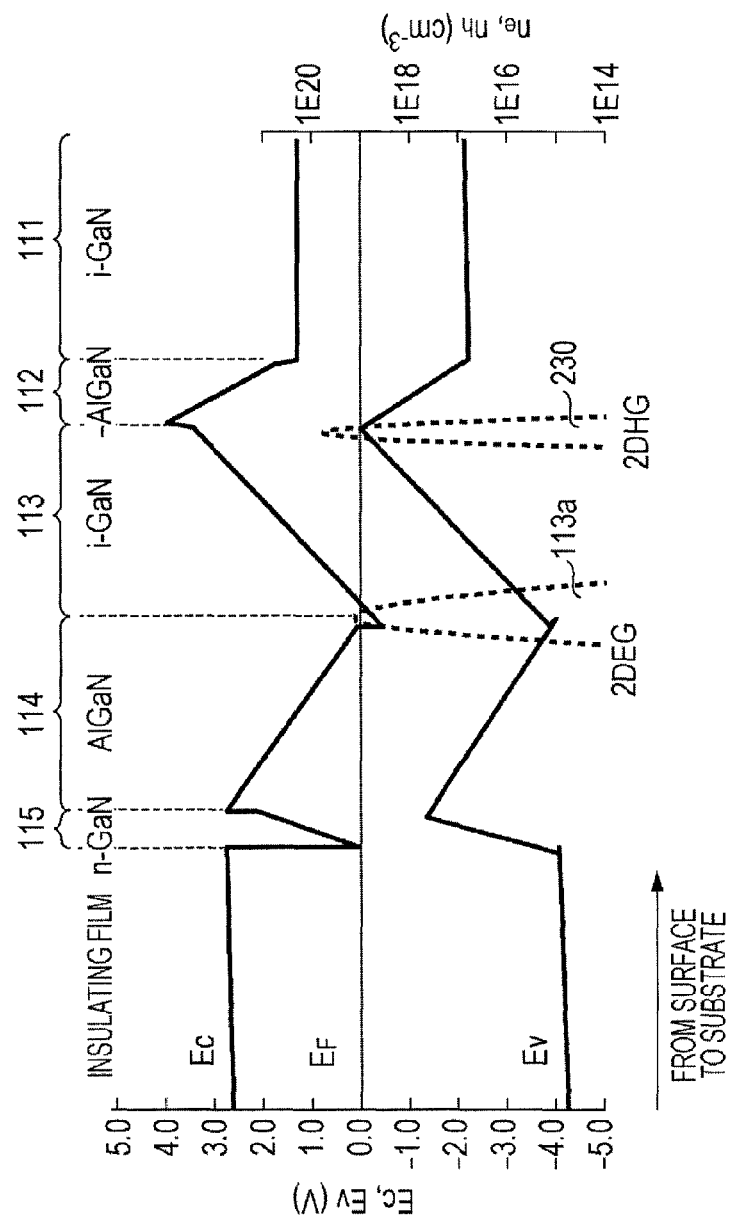
FIG. 8 is a state diagram of a conduction band edge Ec and a valence band edge Ev of the semiconductor device according to the fourth embodiment.

The present embodiment will be described below with reference to FIG. 7. A semiconductor device according to the present embodiment includes 2DHG 230 between the electron supply layer 112 formed of the AlGaN layer and the upper electron transit layer 113 formed of the i-GaN layer. The 2DHG 230 between the electron supply layer 112 and the upper electron transit layer 113 may be generated when the electron supply layer 112 has a predetermined thickness or less and the upper electron transit layer 113 has a predetermined thickness or more. More specifically, when the electron supply layer 112 formed of the AlGaN layer has a thickness of approximately 30 nm and the upper electron transit layer 113 formed of the i-GaN layer has a thickness of 60 nm or more, the 2DHG 230 occurs between the electron supply layer 112 and the upper electron transit layer 113. FIG. 8 illustrates the conduction band edge Ec and the valence band edge Ev along an alternate long and short dashed line 7A-7B between the gate electrode 121 and the source electrode 122 in FIG. 7. The result illustrated in FIG. 8 was obtained with the semiconductor device that included an insulating film disposed on the cap layer 115 between the gate electrode 121 and the source electrode 122.

The upper electron supply layer 114 and the upper electron transit layer 113 are partly etched such that the 2DHG 230 is connected to the source electrode 122. Thus, the electric potential of the 2DHG 230 is fixed to the electric potential of the source electrode 122. This may stabilize the potential barrier at the 2DHG 230 and block a punch-through current from the source electrode 122 to the drain electrode 123 through the 2DHG 230 even with a high drain voltage.

Other details are as described in the second embodiment. The present embodiment may be applied to the first embodiment.

Fifth Embodiment

A fifth embodiment will be described below. A semiconductor device according to the present embodiment has the same structure as the semiconductor device according to the fourth embodiment except that a p-type region 240 is formed between the electron supply layer 112 formed of the AlGaN layer and the upper electron transit layer 113 formed of the i-GaN layer.

Figure 9:
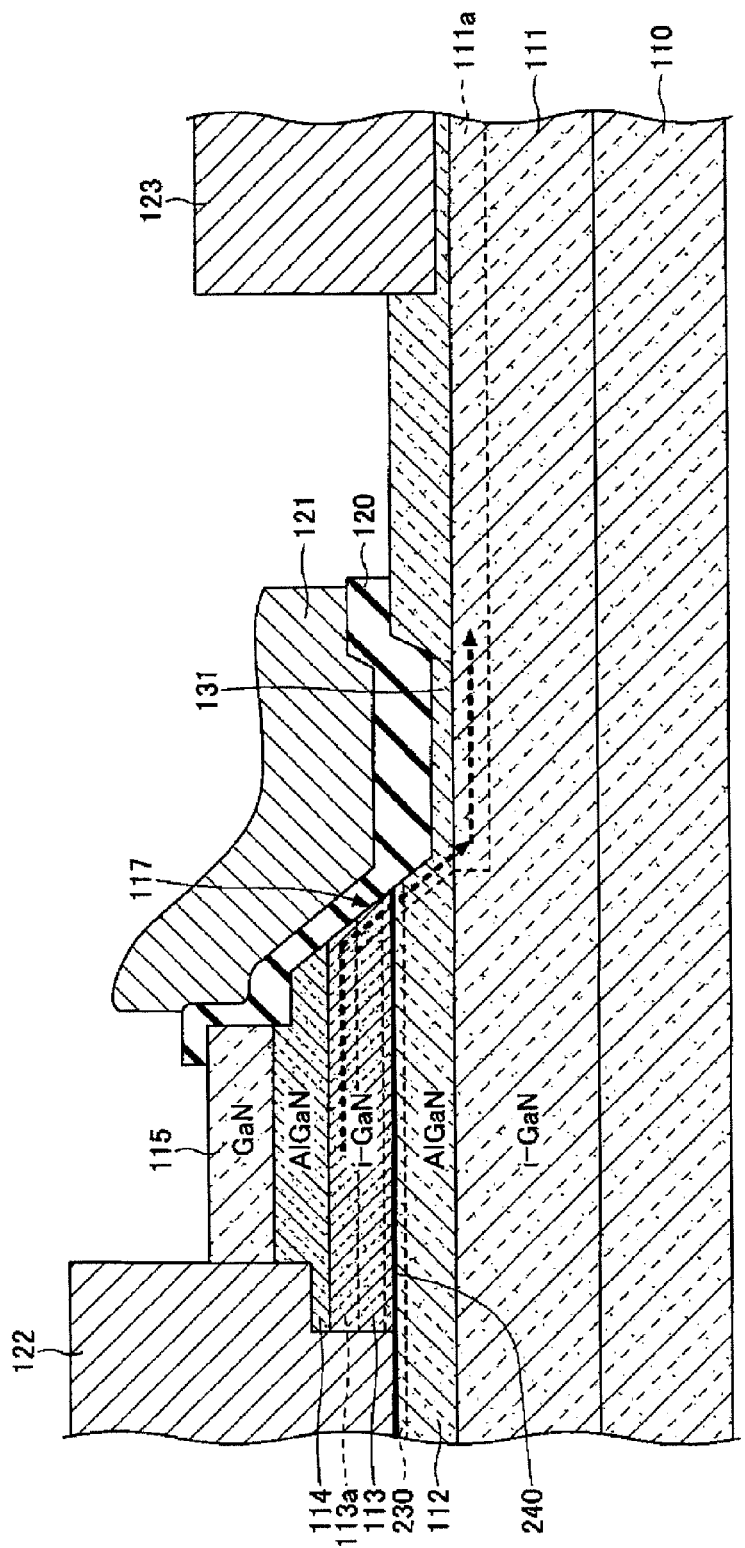
FIG. 9 is a structural drawing of a semiconductor device according to a fifth embodiment.

The semiconductor device according to the present embodiment will be described below with reference to FIG. 9. The semiconductor device according to the present embodiment includes the p-type region 240 between the electron supply layer 112 formed of the AlGaN layer and the upper electron transit layer 113 formed of the i-GaN layer. The p-type region 240 is doped with an impurity element Mg at a concentration of $4 \times 10^{17}$ cm$^{-3}$. The p-type region 240 allows ohmic contact between the source electrode 122 and the 2DHG 230, which is disposed between the electron supply layer 112 formed of the AlGaN layer and the upper electron transit layer 113 formed of the i-GaN layer.

Other details are as described in the fourth embodiment. The present embodiment may be applied to the first embodiment.

Sixth Embodiment

A sixth embodiment will be described below. The present embodiment includes a semiconductor device, a power supply, and a high-frequency amplifier.

Figure 10:
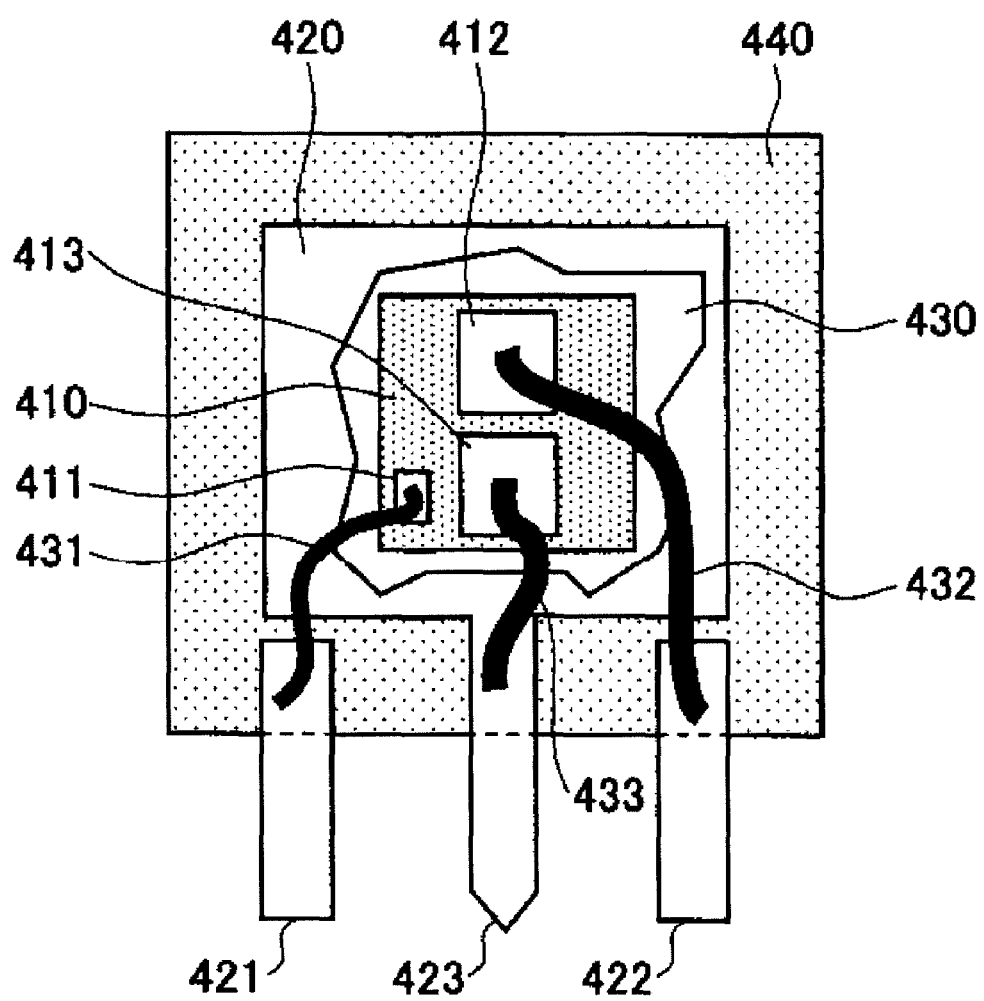
FIG. 10 is an explanatory view of a discrete package of a semiconductor device according to a sixth embodiment.

As illustrated in FIG. 10, the semiconductor device according to the present embodiment includes a discrete package of a semiconductor device according to any one of the first to fifth embodiments. FIG. 10 is a schematic view of the interior of the discrete package of the semiconductor device. The arrangements of electrodes are different from those in the first to fifth embodiments.

First, a semiconductor device according to any one of the first to fifth embodiments is cut into semiconductor chips 410 by dicing. The semiconductor chips 410 are GaN high-electron-mobility transistors (HEMTs). One of the semiconductor chips 410 is fixed to a lead frame 420 with a die attach agent 430, such as solder. The semiconductor chip 410 is a semiconductor device according to any one of the first to fifth embodiments.

A gate electrode 411 is connected to a gate lead 421 with a bonding wire 431. A source electrode 412 is connected to a source lead 422 with a bonding wire 432. A drain electrode 413 is connected to a drain lead 423 with a bonding wire 433. The bonding wires 431, 432, and 433 are made of a metallic material, such as Al. The gate electrode 411 is a gate electrode pad and is connected to the gate electrode 21 or 121 of a semiconductor device according to any one of the first to fifth embodiments. The source electrode 412 is a source electrode pad and is connected to the source electrode 22 or 122 of a semiconductor device according to any one of the first to fifth embodiments. The drain electrode 413 is a drain electrode pad and is connected to the drain electrode 23 or 123 of a semiconductor device according to any one of the first to fifth embodiments.

The semiconductor device is sealed with a molding resin 440 by transfer molding. In this manner, a discrete package of a semiconductor device that includes a HEMT made of a GaN semiconductor material may be manufactured.

A power supply and a high-frequency amplifier according to the present embodiment will be described below. The power supply and the high-frequency amplifier according to the present embodiment include a semiconductor device according to any one of the first to fifth embodiments.

Figure 11:
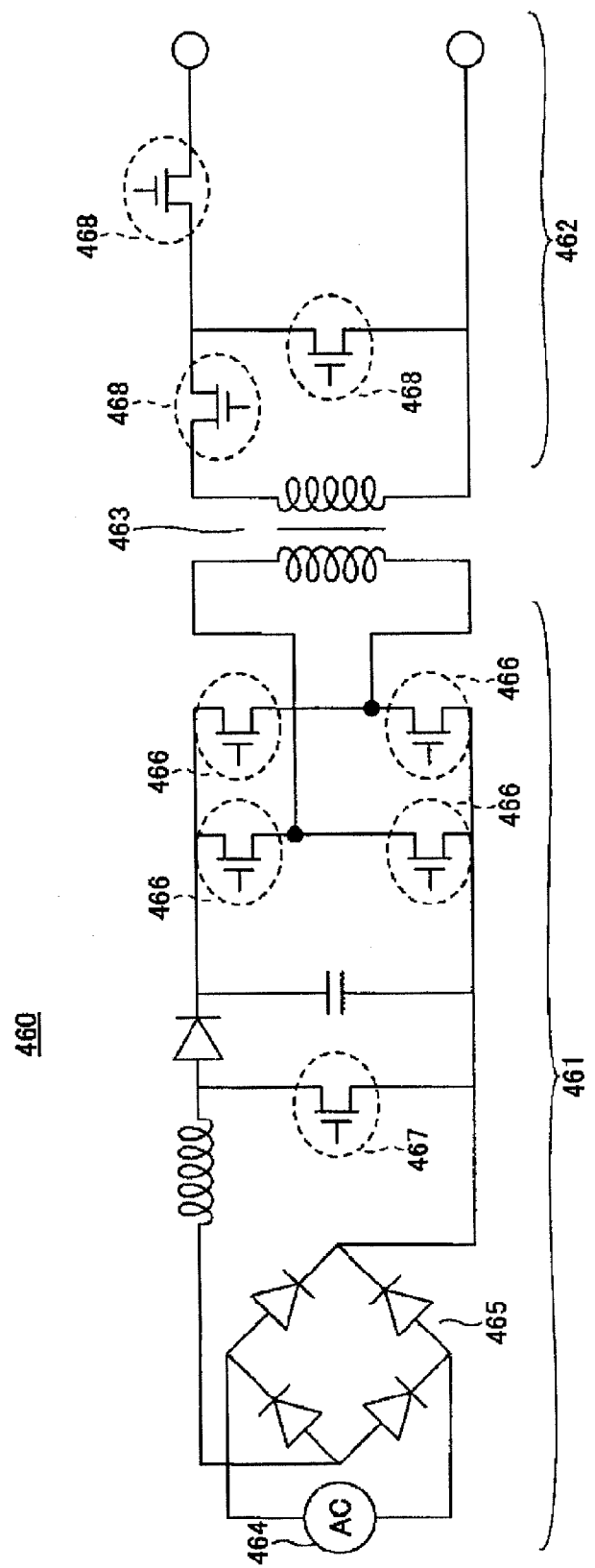
FIG. 11 is a circuit diagram of a power supply according to the sixth embodiment.

The power supply will first be described below with reference to FIG. 11. A power supply 460 according to the present embodiment includes a high-voltage primary circuit 461, a low-voltage secondary circuit 462, and a transformer 463 disposed between the primary circuit 461 and the secondary circuit 462. The primary circuit 461 includes an alternator 464, a bridge rectifier circuit 465, a plurality of switching devices 466 (four in FIG. 11), and a switching device 467. The secondary circuit 462 includes a plurality of switching devices 468 (three in FIG. 11). Each of the switching devices 466 and 467 in the primary circuit 461 is a semiconductor device according to any one of the first to fifth embodiments. The switching devices 466 and 467 in the primary circuit 461 are preferably normally-off semiconductor devices. The switching devices 468 in the secondary circuit 462 are common silicon metal-insulator-semiconductor field-effect transistors (MISFETs).

The high-frequency amplifier according to the present embodiment will be described below with reference to FIG. 12. A high-frequency amplifier 470 according to the present embodiment may be applied to a base station power amplifier for mobile phones. The high-frequency amplifier 470 includes a digital predistortion circuit 471, mixers 472, a power amplifier 473, and a directional coupler 474. The digital predistortion circuit 471 compensates for the nonlinear strain of an input signal. The mixers 472 mix the compensated input signal with an alternating current signal. The power amplifier 473 amplifies the input signal mixed with the alternating current signal. The power amplifier 473 includes a semiconductor device according to any one of the first to fifth embodiments. The directional coupler 474 monitors input and output signals. An output signal mixed with an alternating current signal in the mixers 472 may be sent to the digital predistortion circuit 471, for example, by switching.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device, comprising:
   an electron transit layer made of a semiconductor disposed on a substrate, the electron transit layer having a first band gap;
   an electron supply layer disposed on the electron transit layer, the electron supply layer being made of a semiconductor having a second band gap that is wider than the first band gap;
   a barrier-forming layer disposed on the electron supply layer, the barrier-forming layer being made of a semiconductor having a third band gap that is narrower than the second band gap;
   an upper channel layer disposed on the barrier-forming layer, the upper channel layer being made of a semiconductor doped with an impurity;
   a side surface of the barrier-forming layer and the upper channel layer formed by partly removing the barrier-forming layer and the upper channel layer;
   an insulating film disposed on the side surface;
   a gate electrode disposed on the insulating film;
   a source electrode connected to the upper channel layer; and
   a drain electrode connected to the electron supply layer or the electron transit layer.

2. The semiconductor device according to claim 1, wherein the insulating film is disposed on the side surface and a portion of the electron supply layer from which the barrier-forming layer and the upper channel layer have been removed, and
   the gate electrode is disposed on the insulating film on top of the side surface and the portion of the electron supply layer from which the barrier-forming layer and the upper channel layer have been removed.

3. The semiconductor device according to claim 1, wherein the upper channel layer and the barrier-forming layer are removed between the gate electrode and the drain electrode.

4. The semiconductor device according to claim 1, further comprising:
   2 DEG in the electron transit layer adjacent to the electron supply layer; and
   a potential barrier caused by fixed charges between the electron supply layer and the barrier-forming layer.

5. The semiconductor device according to claim 1, wherein the electron transit layer, the electron supply layer, the barrier-forming layer, and the upper channel layer are made of a nitride semiconductor.

6. The semiconductor device according to claim 1, wherein the electron transit layer, the barrier-forming layer, and the upper channel layer are made of $Al_XGa_{1-X}N$, and
   the electron supply layer is made of $Al_YGa_{1-Y}N$,
   wherein X and Y satisfy $0 \leq X < Y \leq 1$.

7. The semiconductor device according to claim 1, wherein the electron transit layer is made of i-GaN, and
   the electron supply layer is made of AlGaN.

8. The semiconductor device according to claim 1, wherein the barrier-forming layer is made of i-GaN.

9. The semiconductor device according to claim 1, wherein the upper channel layer is made of n-GaN.

10. A semiconductor device, comprising:
    a first electron transit layer made of a semiconductor disposed on a substrate, the electron transit layer having a first band gap;
    a first electron supply layer disposed on the first electron transit layer, the first electron supply layer being made of a semiconductor having a second band gap that is wider than the first band gap;
    a second electron transit layer disposed on the first electron supply layer, the second electron transit layer being made of a semiconductor having a third band gap that is narrower than the second band gap;
    a second electron supply layer disposed on the second electron transit layer, the second electron supply layer being made of a semiconductor having a fourth band gap that is wider than the third band gap;
    a side surface of the second electron transit layer and the second electron supply layer formed by partly removing the second electron transit layer and the second electron supply layer;
    an insulating film disposed on the side surface;

a gate electrode disposed on the insulating film;
a source electrode connected to the second electron supply layer or the second electron transit layer; and
a drain electrode connected to the first electron supply layer or the first electron transit layer.

11. The semiconductor device according to claim 10, wherein the insulating film is disposed on the side surface and a portion of the first electron supply layer from which the second electron transit layer and the second electron supply layer have been removed, and the gate electrode is disposed on the insulating film on top of the side surface and the first electron supply layer from which the second electron transit layer and the second electron supply layer have been removed.

12. The semiconductor device according to claim 10, wherein the second electron supply layer and the second electron transit layer are removed between the gate electrode and the drain electrode.

13. The semiconductor device according to claim 10, further comprising:
2 DEG in the first electron transit layer adjacent to the first electron supply layer;
2 DEG in the second electron transit layer adjacent to the second electron supply layer; and
2DHG between the first electron supply layer and the second electron transit layer.

14. The semiconductor device according to claim 13, wherein the 2DHG is connected to the source electrode.

15. The semiconductor device according to claim 14, further comprising a p-type region doped with a p-type impurity between the first electron supply layer and the second electron transit layer.

16. The semiconductor device according to claim 15, wherein the p-type impurity is Mg.

17. The semiconductor device according to claim 10, wherein the first electron transit layer, the first electron supply layer, the second electron transit layer, and the second electron supply layer are made of a nitride semiconductor.

18. The semiconductor device according to claim 10, wherein the first electron transit layer and the second electron transit layer are made of $Al_XGa_{1-X}N$, and
the first electron supply layer and the second electron supply layer are made of $Al_YGa_{1-Y}N$,
wherein X and Y satisfy $0 \leq X < Y \leq 1$.

19. The semiconductor device according to claim 10, wherein the first electron transit layer is made of i-GaN, and
the first electron supply layer is made of AlGaN.

20. The semiconductor device according to claim 10, wherein the second electron transit layer is made of i-GaN, and
the second electron supply layer is made of AlGaN.

* * * * *